(12) United States Patent
Tu

(10) Patent No.: US 12,034,431 B2
(45) Date of Patent: Jul. 9, 2024

(54) PIEZOELECTRIC MEMS RESONATORS BASED ON POROUS SILICON TECHNOLOGIES

(71) Applicant: Xiang Zheng Tu, San Jose, CA (US)

(72) Inventor: Xiang Zheng Tu, San Jose, CA (US)

( * ) Notice: Subject to any disclaimer, the term of this patent is extended or adjusted under 35 U.S.C. 154(b) by 0 days.

(21) Appl. No.: 18/083,473

(22) Filed: Dec. 17, 2022

(65) Prior Publication Data

US 2023/0116933 A1    Apr. 20, 2023

Related U.S. Application Data

(62) Division of application No. 16/914,079, filed on Jun. 26, 2020, now Pat. No. 11,601,111.

(51) Int. Cl.
| | |
|---|---|
| *H03H 9/17* | (2006.01) |
| *H03H 3/007* | (2006.01) |
| *H03H 3/02* | (2006.01) |
| *H03H 9/02* | (2006.01) |
| *H03H 9/13* | (2006.01) |
| *H03H 9/24* | (2006.01) |
| *H03H 9/15* | (2006.01) |

(52) U.S. Cl.
CPC .......... *H03H 9/173* (2013.01); *H03H 3/0072* (2013.01); *H03H 3/02* (2013.01); *H03H 9/02031* (2013.01); *H03H 9/13* (2013.01); *H03H 9/176* (2013.01); *H03H 9/2405* (2013.01); *H03H 2003/021* (2013.01); *H03H 2003/027* (2013.01); *H03H 2009/155* (2013.01)

(58) Field of Classification Search
CPC ........ H03H 9/173; H03H 3/0072; H03H 3/02; H03H 9/02031; H03H 9/13; H03H 9/176; H03H 9/2405; H03H 2003/021; H03H 2003/027; H03H 2009/155; H03H 2009/02496; H03H 9/02228; H01L 21/0254; H01L 21/02433; H01L 21/02389; H01L 21/02658
See application file for complete search history.

(56) References Cited

U.S. PATENT DOCUMENTS

| | | | | |
|---|---|---|---|---|
| 9,991,868 B1* | 6/2018 | Nguyen | ............... | H03H 9/2426 |
| 2006/0232361 A1* | 10/2006 | Wang | ....................... | H03H 3/02 |
| | | | | 333/191 |
| 2006/0270090 A1* | 11/2006 | Bradley | ............ | H03H 9/02149 |
| | | | | 438/48 |
| 2011/0017593 A1* | 1/2011 | Lee | ....................... | G01N 27/125 |
| | | | | 216/13 |

(Continued)

*Primary Examiner* — Tony Tran
(74) *Attorney, Agent, or Firm* — JW Law Group; James M. Wu

(57) ABSTRACT

A piezoelectric MEMS resonator is provided. The resonator comprises a single crystal silicon microstructure suspended over a buried cavity created in a silicon substrate and a piezoelectric resonance structure located on the microstructure. The resonator is designed and fabricated based on porous silicon related technologies including selective formation and etching of porous silicon in silicon substrate, porous silicon as scarified material for surface micromachining and porous silicon as substrate for single crystal silicon epitaxial growth. All these porous silicon related technologies are compatible with CMOS technologies and can be conducted in a standard CMOS technologies platform.

11 Claims, 6 Drawing Sheets

(56) References Cited

U.S. PATENT DOCUMENTS

2014/0192836 A1* 7/2014 Neilson ............... G01N 29/036
                                                              374/28
2021/0099154 A1* 4/2021 Vercesi ............... H03H 9/0523
2022/0093683 A1* 3/2022 Then ...................... H03H 9/564

* cited by examiner

PIEZOELECTRIC MEMS RESONATORS BASED ON POROUS SILICON TECHNOLOGIES

PRIORITY

This application is a divisional application of U.S. patent application Ser. No. 16/914,079, filed on Jun. 26, 2020 in the name of the same inventor and entitled "Piezoelectric MEMS Resonators based on Porous Silicon Technologies," which has been issued with a U.S. Pat. No. 11,601,111 on Mar. 7, 2023, which is incorporated herein by reference in its entirety.

FIELD OF THE INVENTION

The present invention relates generally to a piezoelectric MEMS resonator and more particularly to a piezoelectric MEMS resonator designed and fabricated based on porous silicon related technologies.

BACKGROUND

Resonators can be used to either generate waves of specific frequencies such as oscillators or to select specific frequencies from a signal such as filters. Wireless communications enable resonators to have a wide variety of applications, such as satellite transmission, radio and television broadcasting, sensor networks, global positioning system (GPS), and mobile communications which provide us with voice, data and broadband communication.

A ubiquitous component in modern integrated electronic systems is a frequency-reference circuit. Piezoelectric quartz crystals offering a large quality factor superior frequency temperature stability reliability, technical maturity, and extensive commercial availability are presently in high demand for use in such frequency selection and clocking applications. The requirement of quartz crystals and crystal oscillators has been growing steadily fueled by the tremendous growth in demand for various electronic equipment.

But, resonators based on quartz do have some limitations. These can not be miniaturized easily for on-chip usage, involves a costly manufacturing process, and their performance degrades when subjected to severe levels of shock and vibration. Again, the on-chip tank circuits with monolithic inductors and capacitors provided by the present-day integrated circuit technology suffer from poor Q-values.

U.S. Pat. No. 10,291,200 titled as "Methods and devices for micro-electro-mechanical resonators (MEMS)" disclosed MEMS based sensors which potentially can address critical considerations for users including accuracy, repeatability, long-term stability, ease of calibration, resistance to chemical and physical contaminants, size, packaging, and cost effectiveness. Accordingly, it would be beneficial to exploit MEMS processes that allow for manufacturability and integration of resonator elements into cavities within the MEMS sensor that are at low pressure allowing high quality factor resonators and absolute pressure sensors to be implemented. Embodiments of the invention provide capacitive sensors and MEMS elements that can be implemented directly above silicon CMOS electronics.

These MEMS based resonators have emerged as an attractive alternative which can offer Q-values close to that for quartz in both vacuum as well as in air and operating frequencies up to a very-high frequency range, consume less power, provide better temperature stability and better aging stability better, have shorter design and production cycle times, and can be monolithically integrated and fabricated using low-cost CMOS compatible processes. In addition, MEMS resonators are very robust to shock and vibration, and provide an overwhelming size advantage.

The main limitation with capacitive resonators is that the capacitive transduction mechanism is employed to excite the resonance mode of a micromechanical structure and also to detect the vibration amplitude. Narrow gaps are designed between the highly conductive resonator body and the conductive electrodes. A polarization voltage is applied between the electrodes and the resonator to create the required electric field for excitation and detection. The motional impedance of capacitive devices is inversely proportional to the capacitive gap size to the fourth power. Large motional impedance tends to escalate as the frequency increases. Therefore, in order to realize reasonably small impedances at high frequencies very small gap sizes are required, which are challenging to fabricate.

In contrast to capacitive resonators, piezoelectric resonators can be fabricated with relative ease using low-temperature processes and inherently have lower motional impedance due to greater coupling. The piezoelectric resonators include surface acoustic wave (SAW) resonators and thin-film bulk acoustic resonators (FBARs). The main drawbacks of typical SAW devices are their large size and the incompatible substrates for microelectronic integration. On the other hand, FBARs can be integrated with on-chip electronics. They have also been demonstrated at gigahertz frequencies and center frequencies can be moderately controlled by choosing metal film patterns. However, obtaining higher Q and multiple dispersed frequency standards on a single substrate is challenging.

A new class of resonators called thin-film piezoelectric-on-substrate (TPoS) resonators benefit from high electromechanical coupling of piezoelectric transduction mechanism and superior acoustic properties of single crystal silicon. Therefore, the motional impedance of these resonators are significantly smaller compared to typical capacitively transduced counterparts while they exhibit relatively high quality factor and power handling and can be operated in air. The combination of all these features suggests TPoS resonators as a viable alternative for current acoustic devices.

U.S. Pat. No. 8,450,913 titled as "Tunable Piezoelectric MEMS Resonators suitable for real-time clock applications" disclosed a micro-electro-mechanical resonator which can include a suspended frame-shaped beam anchored at four corners thereof to a surrounding substrate along with a suspended resonator plate tethered on four sides thereof to corresponding sides of the frame-shaped beam. A pair of electrodes is provided on first and third diametrically opposite corners of the frame-shaped beam and a pair of sense electrodes are provided on second and fourth diametrically opposite corners of the frame-shaped beam. The resonator may also include a ground electrode on the frame-shaped beam and a piezoelectric layer sandwiched between each of the drive and sense electrodes and the ground electrode.

U.S. Pat. No. 10,158,340 titled as "Micromechanical devices based on piezoelectric resonators" disclosed a piezoelectrically transduced resonator device which includes a wafer having a substrate, a buried oxide layer formed on the substrate, and a device layer formed on the buried oxide layer, and a resonator suspended within an air gap of the wafer above the substrate, the resonator including a portion of the device layer, a piezoelectric layer, and top and bottom electrodes contacting top and bottom sides of the piezoelectric layer, wherein the portion of the device layer is not directly connected to the wafer and wherein the resonator is configured to move relative to the substrate under electrostatic force to tune the frequency of the resonator device when a direct current voltage is applied between the substrate and the portion of the device layer of the resonator.

U.S. Pat. No. 10,291,203 titled as "Piezoelectric MEMS resonator with a high quality factor" disclosed a MEMS resonator which is provided with a high quality factor and lower motional impedance. The MEMS resonator includes a silicon layer having opposing surfaces, a piezoelectric layer above one of the surfaces of the silicon layer, and a pair of electrodes disposed on opposing surfaces of the piezoelectric layer, respectively. Moreover, the piezoelectric layer has a crystallographic axis that extends at an angle relative to the vertical axis of the MEMS resonator.

Unfortunately, all above-disclosed thin-film piezoelectric-on-substrate resonators were fabricated using bulk micromachining which is incompatible with CMOS processing. This incompatibility does not allow mechanical devices to be built at the same time as the electronic logic circuits. Also, the cost of fabrication is generally higher since this technology can not be run using the same equipment as the semiconductor industry.

Furthermore, the disclosed thin-film piezoelectric-on-substrate resonators were fabricated each using a SOI wafer with a certain thickness of the top silicon layer and a certain thickness of the buried silicon dioxide layer which is not suitable for the design of various purpose thin-film piezoelectric-on-substrate resonators.

In addition, the above disclosed thin-film piezoelectric-on-substrate resonators were fabricated using a backside deep RIE for etching through the thick silicon layer of the SOI wafer so as to release the thin silicon MEMS structure. Then there are two fabrication steps followed: one is HF etching of the buried silicon dioxide layer and the other is to remove a protection layer on the frond surface. Since the released thin silicon MEMS structure is fragile these fabrication steps must become a huge challenge.

It would be desired to use surface micromachining instead of bulk micromachining for fabricating thin-film piezoelectric-on-substrate resonators. In particular, the surface micromachining is based on porous silicon related technologies which includes selective formation and etching of a porous silicon layer in silicon substrate, a porous silicon layer as a sacrificial material for micromachining and a porous silicon layer as a substrate for single crystal silicon epitaxial growth.

It would be beneficial that the thin-film piezoelectric-on-substrate resonator is arranged in a selected region of a silicon substrate so as to allow the resonator to be integrated with a CMOS IC in the silicon substrate which can be realized by the surface micromachining based on porous silicon related technologies.

It would be beneficial that the thin-film piezoelectric-on-substrate resonator is fabricated using a single crystal silicon epitaxial layer with a thickness allowed to be adjusted in a large range and a buried cavity with a gap allowed to be adjusted in a large range which can be realized by the surface micromachining based on porous silicon related technologies.

It would be beneficial that the thin-film piezoelectric-on-substrate resonator is fabricated on a standard CMOS technologies platform since the surface micromachining based on porous silicon related technologies are comparable with CMOS technologies.

SUMMARY OF THE INVENTION

It is an object of the present invention to provide a piezoelectric MEMS resonator designed and fabricated based on porous silicon related technologies which has a piezoelectric resonance structure supported by a single crystal silicon microstructure suspended over a buried cavity formed in a silicon substrate.

It is another object of the present invention to provide a piezoelectric MEMS resonator designed and fabricated using a porous-silicon based surface micromachining technology which allows a single crystal silicon microstructure to be arranged in a selective region of a silicon substrate used for a CMOS IC fabrication so as to integrate the resonator and the CMOS IC in a same silicon substrate.

It is still another object of the present invention to provide a piezoelectric MEMS resonator designed and fabricated based on porous silicon related technologies which allows a single crystal silicon microstructure to be fabricated in a selected region of a single crystal silicon epitaxial layer grown on a porous silicon layer formed in a silicon substrate so as to realize integration of a resonator and a CMOS IC in a same crystal silicon epitaxial layer.

It is still another object of the present invention to provide a piezoelectric MEMS resonator designed and fabricated based on porous silicon related technologies which has a single crystal silicon microstructure made of a single crystal silicon epitaxial layer with a free adjusted thickness.

It is still another object of the present invention to provide a piezoelectric MEMS resonator designed and fabricated based on porous silicon related technologies which has a buried cavity with a gap able to prevent a suspended microstructure from damage when an external force such as a mechanical shock to occur.

It is still another object of the present invention to provide a piezoelectric MEMS resonator designed and fabricated based on porous silicon related technologies has a buried cavity with a rough bottom able to prevent a suspended microstructure from stick when it occasionally touches the bottom.

It is still another object of the present invention to provide a piezoelectric MEMS resonator designed and fabricated based on porous silicon related technologies which allows conducting a post-release process for suspending of a single crystal silicon microstructure over a buried cavity.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The present disclosure may be better understood with reference to the following figures. Matching reference numerals designate corresponding parts throughout the figures, which are not necessarily drawn to scale.

FIG. 2 illustrates a first mask being used to form a porous silicon layer in a silicon substrate.

FIG. 3 illustrates a single crystal silicon layer is formed on the porous silicon layer through chemical vapor deposition (CVD).

FIG. 4 illustrates a silicon dioxide layer is formed on the surface of the silicon substrate including the silicon epitaxial layer.

FIG. 5 illustrates a pattern of a bottom electrode layer that is formed on the surface of the silicon dioxide layer using a second mask.

FIG. 6 illustrates a pattern of a piezoelectric layer that is formed on the surface of the bottom electrode layer using a third mask.

FIG. 7 illustrates a pattern of a top electrode layer that is formed on the surface of the piezoelectric layer using a forth mask.

FIG. 8 illustrates a trench is formed to divide the silicon substrate into a central region and a surrounding region so that the central region is positioned on the top of the porous silicon layer.

FIG. 9 illustrates a buried cavity that is formed by selective etching of the porous silicon layer in the process of finishing the fabrication process.

DETAILED DESCRIPTION

Radio frequency (RF) communication circuits like reference oscillators, filters, and mixers based on such micro-electro-mechanical system (MEMS) resonators can be utilized for meeting the increasing count of RF components likely to be demanded by the next-generation multi-band/multi-mode wireless devices. MEMS based on-chip resonators have shown significant potential for sensing and high frequency signal processing applications. This is due to their excellent features like small size, large frequency-quality factor product, low power consumption, low cost batch fabrication, and integrability with complementary Metal-Oxide Semiconductor integrated circuit (CMOS IC) technology.

The utilization of the conventional CMOS IC technology as a platform for design and fabrication of the fast-growing RF MEMS devices has led to development of porous silicon related MEMS technologies. The porous silicon related MEMS technologies include selective formation and etching of porous silicon in silicon substrate, porous silicon as scarified material for surface micromachining and porous silicon as substrate for single crystal silicon epitaxial growth. The present invention provides a piezoelectric MEMS resonator designed and fabricated based on the porous silicon related technologies. Since the porous silicon related technologies are compatible with CMOS technologies the piezoelectric MEMS resonator can be realized using a standard CMOS technologies platform.

Figure 1:
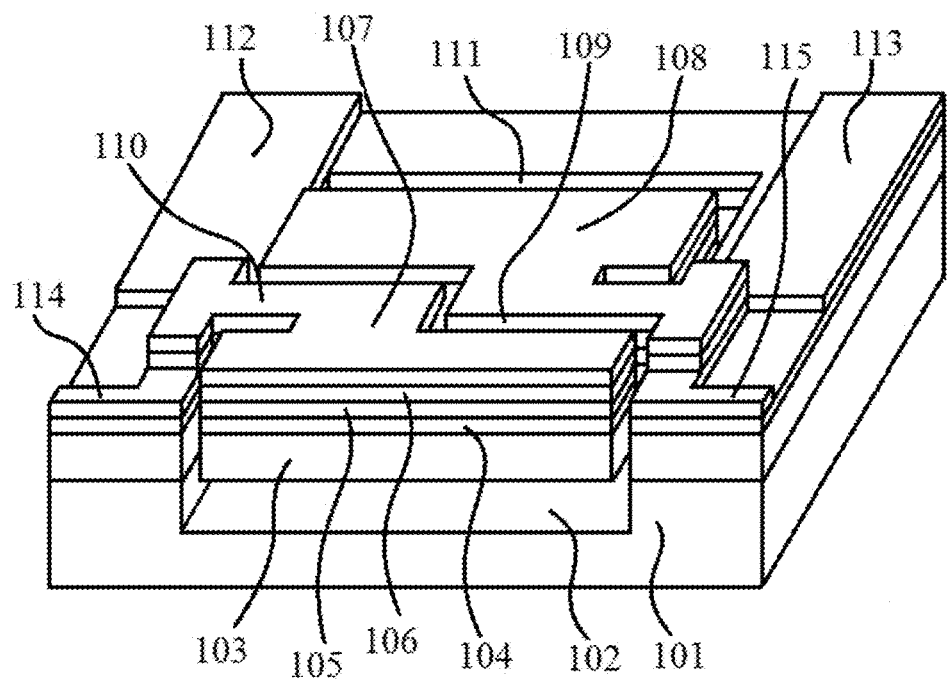
FIG. 1 is a perspective view of a piezoelectric MEMS resonator based on porous silicon related technologies which is provided by the present invention.

FIG. 1 shows a piezoelectric MEMS resonator based on porous silicon related technologies which is provided by the present invention. The MEMS resonator comprises: a microstructure including: a silicon substrate 101, a single crystal silicon epitaxial layer 103, a buried cavity 102 created by selective etching of a porous silicon layer formed in the silicon substrate 101, a single crystal silicon plate made of the single crystal epitaxial layer 103 and anchored to the silicon substrate 101 through two flexible single crystal silicon beams 110 made of the single crystal silicon epitaxial layer 102, which are all suspended over the buried cavity 102; a piezoelectric resonance element including: a silicon dioxide layer 104, a bottom electrode 105, a middle piezoelectric layer 106, a top drive electrode 107, a top sense electrode 108, and a top electrode isolation gap 109, which are all vertically stacked on the single crystal silicon plate; and several electrical connecting elements including: bonding pad 112 and 113 connecting to top drive electrode 107 and top sense electrode 108 respectively, and bonding pad 114 and 115 both connecting to the bottom electrode 105, wherein the MEMS resonator is configured to operate in lateral resonance mode.

The piezoelectric MEMS resonator based on porous silicon related technologies can be operate in one-port mode resonator or two-port mode resonator which depends on the drive electrode and the sense electrode shared or separated. As shown in FIG. 1, the present resonator is configured as a two-port mode, since there are two pairs of electrodes: the drive electrode 208a and the sense electrode 208b are separately arranged on the top of the piezoelectric layer 209. In operation of the resonator the signal applied to the drive electrode is converted to an acoustic vibration in the device and the sense electrode converts the vibration back to an electrical signal. The vibration is an elastic-wave motion transverse to the applied electric field. The resonance frequency of the excited lateral mode is mostly dependent on the in-plane dimensions of the device structure.

The advantage of utilizing the lateral mode is that since the lateral dimension of the resonator is defined lithographically, the operation frequency of the devices fabricated on a single substrate can span a wide range (from few MHz to a few GHz). Whereas, thickness mode resonators (one-port mode) fabricated on a substrate, are bound to have almost the same center frequency since the device thickness is the same all over the substrate. On the other hand, the piezoelectric materials used to make the piezoelectric MEMS resonators are sputtered polycrystalline materials which are mostly transversely isotropic. In other words, the z axis (orthogonal to the plane) has an infinite order of symmetry and it has the largest piezoelectric coefficient (d33). Therefore, compared to lateral mode resonators where (d31) is utilized to excite the resonance mode the electromechanical coupling is larger for thickness mode resonators. Consequently, the motional impedance of a thickness-mode resonator is lower considering the same-size actuation (electrode) area.

It has been shown that porous silicon is emerging in micromachining technology as an excellent material for use as a sacrificial layer. This is largely due to the ease to obtain by electrochemical dissolution of silicon wafers in aqueous HF solutions. The rate of pore formation is heavily dependent upon the doping type and concentration of the silicon, allowing patterned porous silicon formation through selective doping of the substrate. Silicon that has been made porous can be quickly and easily removed in a dilute hydroxide solution, as low as 1%. Porous silicon technology offers the unique ability to fabricate free-standing structures in single-crystal silicon with separation distances from the substrate ranging from a few microns to over one hundred microns.

It has been reported that silicon grown by the epitaxial process on porous silicon is one of the powerful technologies for growth of low-cost high-efficiency silicon for photovoltaic applications. It has been shown that excellent minority carrier lifetimes and diffusion lengths of several hundred micrometers can be achieved on a thin epitaxial silicon epitaxial layer which is commonly used for CMOS IC fabrication.

As shown in FIG. 1, the buried cavity 102 is created by selective etching of a porous silicon layer formed in the silicon substrate 101. The vertical gap of the buried cavity 102 can be adjusted according to the resonator design. Since the suspending structure of the resonator is supported by the two flexible single crystal silicon beams 110 it may bend down to the cavity 102 when an external force such as a mechanical shock occurs. In order to prevent the suspending structure from breaking, the vertical gap of the buried cavity 102 is made in a range of 1 to 5 μm and less than the maximum displacement of the suspending structure. If not the suspending structure will be broken.

Stiction or adhesion of the suspending structure to the bottom of the buried cavity 102 is a major failure mechanism in the MEMS resonators. It is interesting to know that the surface of the bottom of the buried cavity 102 is made to be inherently rough so as to prevent the suspending structure from sticking to the bottom when the suspending structure occasionally touches the bottom. The inherent rough of the bottom of the buried cavity 102 is produced by selective etching of the porous silicon layer.

The silicon epitaxial layer 102 is grown on the porous silicon layer by chemical vapor deposition. The porous silicon layer is made to have a double layer structure with a top layer of ~20% porosity and a bottom layer of 50% porosity. The thickness of the silicon epitaxial layer 102 is allowed to be optimized for CMOS IC fabrication and also can be adjusted in the range of 3 to 30 μm depending on the resonator design.

The bottom electrode 105, the top drove electrode 107 and the top sense electrode 108 are made of Cr/Au or Pt/Au double metal layers. The Cr/Au or Pt/Au pattern is made by sputtering and then patterned by lift-off process. In a lift-off process, a pattern is exposed into photoresist and a metal layer is deposited over the entire area, then the photoresist is washed away to leave behind the metal layer only in the patterned area.

The piezoelectric resonance layer 106 is made of Pb(Zr, Ti)O$_3$ (PZT), ZnO or AlN thin film which is deposited by sputtering and patterned by lift-off process.

PZT thin film has been broadly applied in various kinds of MEMS devices, such as ferroelectric random access memory, digital switch, vibration energy harvesting, and piezoelectric proton exchange membrane fuel cells. PZT thin film could be utilized in these applications due to the fact that it possesses low leakage current density, large electromechanical coupling coefficient, and excellent dielectric properties.

Piezoelectric ZnO films are widely used for the generation and detection of acoustic waves in non-piezoelectric substrates. In recent years these films have been combined with standard bipolar or CMOS IC processes to realize acoustic wave devices integrated with electronic circuits.

The non-ferroelectric polar wurtzite aluminium nitride (AlN) material has been shown to have potential for various sensor applications both utilizing the piezoelectric effect directly for pressure sensors or indirectly for acoustic sensing of various physical, chemical and biochemical sensor applications. Sputter deposited AlN thin films have played a central role for successful development of the thin film electro-acoustic technology. The development has been primarily driven by one device—the thin film bulk acoustic resonator with its primary use for high frequency filter applications for the telecom industry. AlN has been the dominating choice for commercial application due to compatibility with the integrated circuit technology, low acoustic and dielectric losses and high acoustic velocity in combination with comparably high electromechanical coupling.

It has been revealed that single crystal silicon is a preferred material for fabricating MEMS resonators. The advantages of the MEMS resonators have been summarized as: (1) Q values greater than 100,000 are possible, (2) it has an energy density three orders greater than quartz, (3) it has ideal extensional modes of resonance not found in any other materials, and (4) its material properties are stable, well-characterized and repeatable to enable design for manufacturability, and it enables a high-yield fabrication technology. Finally, a piezoelectric transduction scheme is employed in lieu of capacitive transduction for its greater electromechanical coupling. It has been demonstrated that the single crystal silicon substrate together with the piezoelectric film also enables resonator configuration and mode of operation that has superior power handling, a greater quality factor at ultra high frequency frequencies, and exceptional manufacturability.

According to the present invention a method for fabricating a piezoelectric MEMS resonator based on porous silicon related technologies comprises fabrication steps:

Forming a porous silicon layer in a silicon substrate by anodic etching of crystalline silicon in hydrofluoric acid;

Growing a single crystal silicon layer on the entire surface of the silicon substrate including the surface of the porous silicon layer by chemical vapor deposition (CVD);

Depositing a silicon dioxide layer on the entire surface of the silicon epitaxial layer by plasma enhanced chemical vapor deposition (PECVD);

Creating a bottom electrode and two bonding pads on the surface of the silicon dioxide layer by metal sputtering and lift-off process;

Creating a piezoelectric resonance layer on the surface of the bottom electrode by piezoelectric material sputtering and lift-off process;

Creating a top drive electrode, a top sense electrode, a top electrode isolation gap and two bonding pads so that the top drive electrode, the top sense electrode, and the top electrode isolation gap located on the surface of the piezoelectric resonance element and the bonding pads on the surface of the silicon dioxide layer by metal sputtering and lift-off process;

Creating a dividing trench by plasma etching so as to separate the silicon substrate into two regions: a central region including the top electrode, the top sense electrode and the top electrode isolation gap and a surrounding region including the bonding pads connecting to the bottom electrode and the bonding pads connecting to the top drive electrode and the top sense electrode, wherein the trench is separated by two symmetrical supporting beams which connect the two separated regions, the upper of the trench is created by previews steps and lower of the trench is created by plasma etching of the silicon dioxide layer and the single crystal silicon epitaxial layer so to reveal the buried porous silicon layer; and Removing the porous silicon layer by selective etching of the porous silicon layer so as to result in a buried cavity, a central region, and two supporting beams which all are suspended over the buried cavity.

FIGS. 2-9 illustrate the method for fabricating a piezoelectric MEMS resonator based on porous silicon related technologies according to the present invention.

Figure 2:
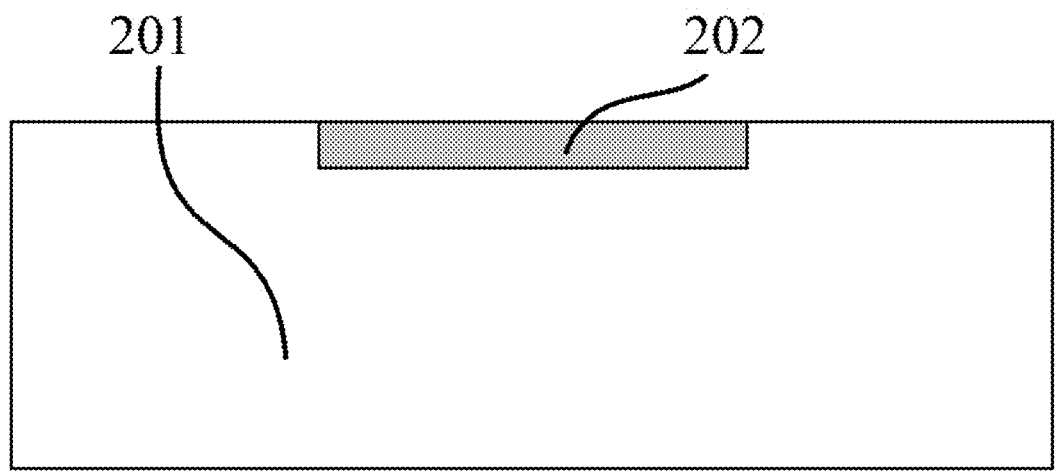
FIGS. 2-9 illustrate the method for fabricating a piezoelectric MEMS resonator based on porous silicon related technologies which is provided by the present invention.

Reference to FIG. 2, a porous silicon layer 202 is formed in a silicon substrate 201. The silicon substrate 201 is preferably a (100) p-type silicon substrate with a resistivity ranging in 0.01 to 0.02 Ω-cm. Before porous silicon formation an ohmic contact is created on the back surface of the silicon substrate 201 by heavily p-type doping. Then a 100 nm thick silicon carbide layer is deposited on the front surface of the silicon substrate 201 by PECVD and a silicon carbide mask is created by a photolithographic process.

Afterwards, a double (two-layer structure) porous silicon layer 202 is formed in the silicon substrate 201 by anodization (note: porous silicon is a sponge-like structure of single crystalline silicon). The anodization is carried out in a mixture of 40% HF acid and ethanol (1:1 in volume ratio) as the electrolyte. In order to obtain porosities of ~20% for the top layer and ~50% for the bottom layer of the double porous silicon layer, the anodic current densities are selected to be 5 and 20 $mA/cm^2$ for the low- and high-porosity layers, respectively. The corresponding thicknesses of the layers are set to be 0.5 µm and 0.5 to 4.5 µm, respectively. The top shape of the porous silicon layer is preferably configured to be square with a side length of 300 to 800 µm.

Figure 3:
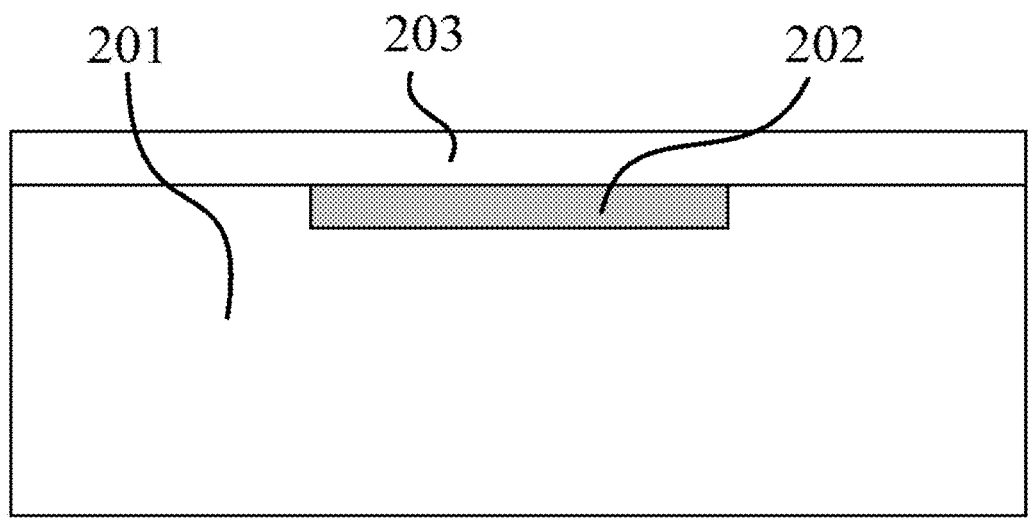

Reference to FIG. 3, a single crystal silicon epitaxial layer 203 is grown on the entire surface of the silicon substrate 201 including the surface of the porous silicon layer 202 by chemical vapor deposition (CVD). To do this the porous silicon layer 202 is slightly oxidized in $O_2$ ambient at 400° C. for 1 h. This is for passivating the pore walls of the porous silicon layer 202 for suppressing structural change in the pore feature size during the following thermal processes. Then the silicon carbide layer on the surface of the silicon substrate is removed by dry etching. In the CVD process, the porous silicon layer 202 is annealed in an epitaxial reactor at ~1130° C. in 1 atm of dry hydrogen ambient for 5 to 10 min. As a result, the pores of the top layer of the porous silicon layer 202 are closed so as to form a densified silicon layer as a seed layer for the epitaxial growth. Then an n-type single silicon epitaxial layer 203 is grown so as to have a resistivity of ~7.5 Ω-cm and a thickness of 1 to 30 µm according to the device design. The specification of the single silicon epitaxial layer 203 is preferably to be set by a designed resonator with a CMOS IC in a single crystal silicon substrate.

Figure 4:
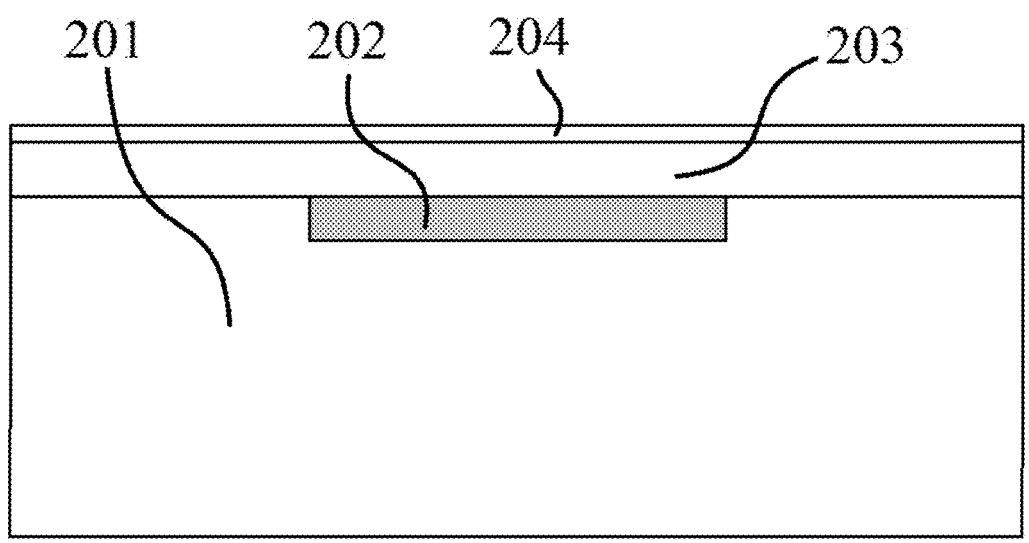

Reference to FIG. 4, a silicon dioxide layer 204 is deposited on the entire surface of the silicon substrate 201 including the surface of the single silicon epitaxial layer 203 by plasma enhanced chemical vapor deposition (PECVD).

Figure 5:
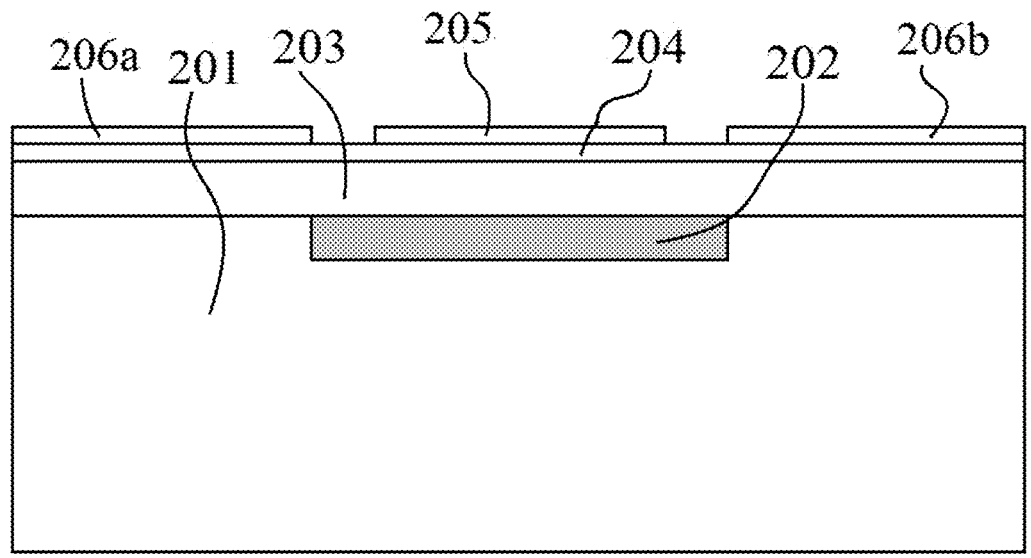

Reference to FIG. 5, a bottom electrode layer 205 and two bonding pads 206a and 206b are created on the surface of the silicon dioxide layer 204. The bottom electrode layer 206 and two bonding pads 206a and 206b are made of a Cr/Au or Pt/Au double metal layer. Cr or Pt as adhesion layer with thickness 90 nm and Au as conduction layer with 500 to 1000 nm are deposited through sputtering. The pattern of the bottom electrode is created by the lift-off process.

Patterning of multilayer containing such as Pt, Au, Cr metals or such as PZT, ZnO, AlN piezoelectric materials, will be performed using lift-off process. For these materials, dry etching techniques are not readily available. In the lift-off process, an inverse pattern is first formed in a sacrificial layer deposited on a substrate, using lithographic techniques. Next, the thin film is deposited over the entire layer and in the openings of the pattern. Those portions of the thin film which are deposited on the sacrificial layer are removed (lifted-off) when the substrate is immersed in a suitable solvent, leaving behind the desired thin film pattern.

Figure 6:
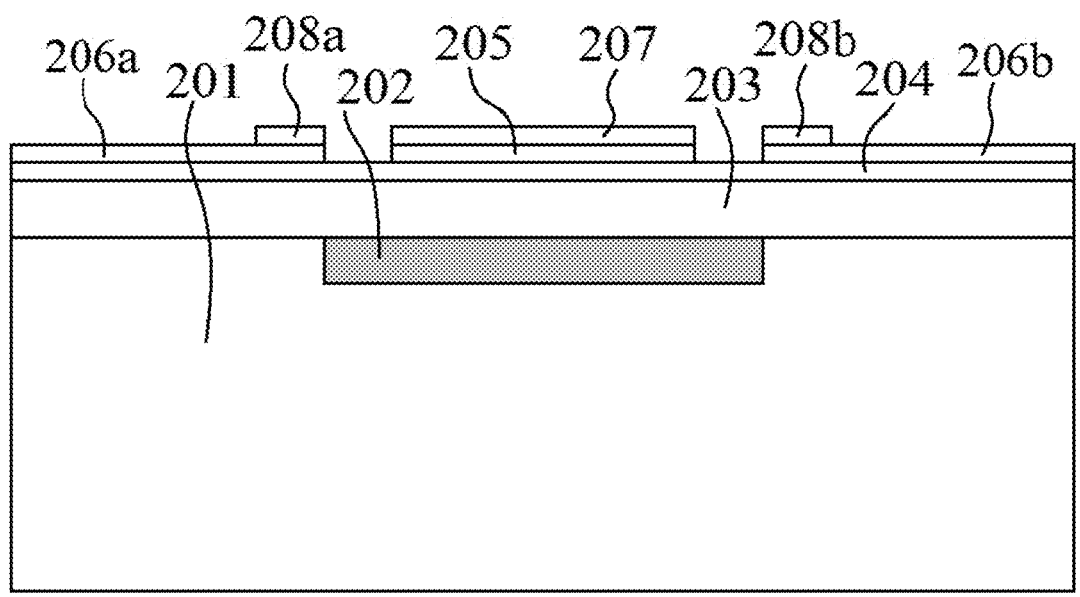

Reference to FIG. 6, a pattern of a piezoelectric layer including a resonance layer 207, two edge electrode insulation layer 208a and 208b, is created on the surface of the bottom electrode layer 206. The pattern is made of a PZT, ZnO, or AlN layer and patterned by the lift-off process.

A 150 to 600 nm thick PZT layer is deposited from a PZT ceramic target through RF sputtering. In order to eliminate the formation of the pyrochlore phase in the PZT layer, the annealing treatment is implemented in the air with a rapid thermal process at 500 to 700° C. Then the PZT layer is cooled down to room temperature naturally.

As an alternative, a ZnO layer with a thickness of 300 to 700 nm is deposited by RF magnetron sputtering, using a high-purity (99.999%) zinc oxide ceramic target. Argon and oxygen are used as sputtering gases. The percentage of oxygen flow in the process gas varied over the range 7.3-12.5% (deposition time: 90 min), and an additional layer without oxygen in the gas composition was fabricated (using 100% argon, with 60 min of deposition time).

As another alternative, an AlN layer is deposited on silicon substrates using pure Al targets reactively sputtered in nitrogen and argon environments with the application of negative DC voltage on the cathode. A Ti under-layer (seed layer) is used as the adhesion layer for the AlN layer and also a seed layer for the texture growth of the functional AlN layer. With the processing parameter: 250 W, 3 mT, pure Nitrogen, 3 h and −50V bias, a 500-700 nm thick AlN layer can be prepared. The layer undergoes a post-annealing treatment of 600° C. for two hours to improve its electrical properties.

Figure 7:
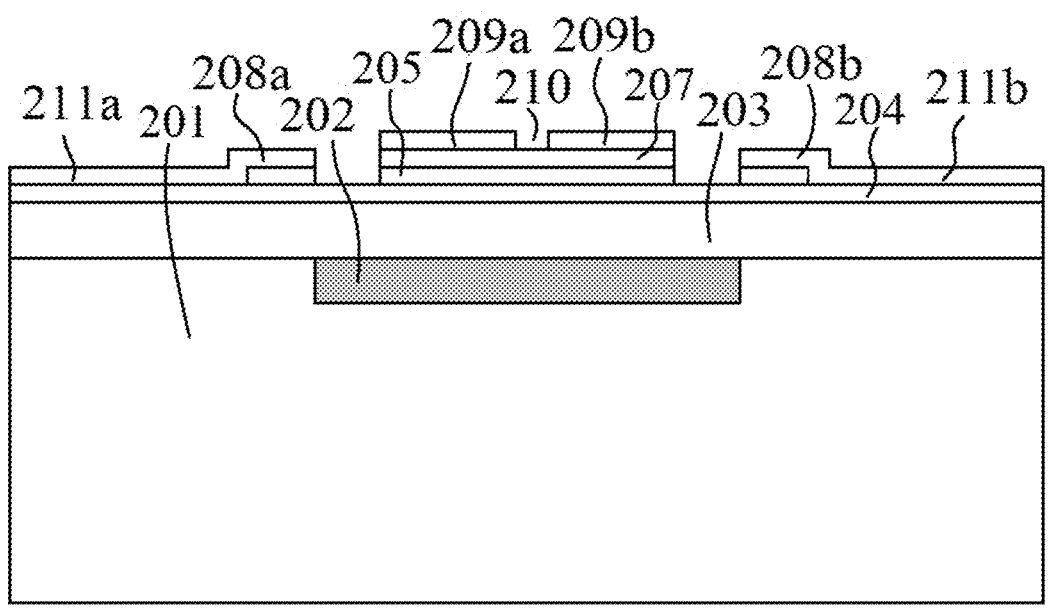

Reference to FIG. 7, a top electrode pattern includes a top drive electrode 209a, a top sense electrode 209b, and a top electrode isolation gap 210, which all is arranged on the surface of the piezoelectric resonance layer 207, and two bonding pads 211a and 211b both arranged on the surface of the silicon dioxide layer 204. The bottom electrode pattern is made of a Cr/Au or Pt/Au double metal layer. Cr or Pt as adhesion layer with thickness 90 nm and Au conduction layer with a thickness of 500 to 100 nm are deposited through sputtering. The top electrode pattern is created by the lift-off process, and a top electrode isolation gap 210 is also formed.

Figure 8:
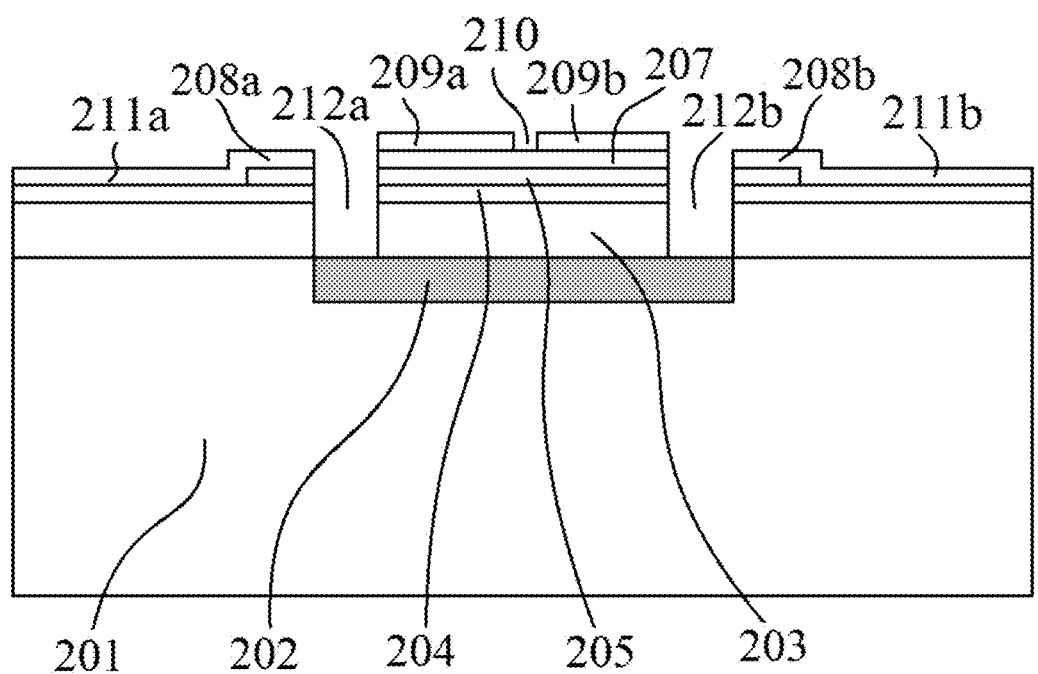

Reference to FIG. 8, a trench including a part 212a and a part 212b is created by plasma etching so as to divide the silicon substrate 201 into two regions: a central region including the top drive electrode 209a, the top sense electrode 209b and the top electrode isolation gap 210 and a surrounding region including the bonding pads 206a and 206b connecting to the bottom electrode and the bonding pads 211a and 211b connecting to the top drive electrode 209a and the top sense electrode 209b respectively. The trench is separated by two symmetrical supporting beams 110 as shown in FIG. 1, which connect the two separated regions. The upper of the trench is created by previous fabrication steps and the lower of the trench is created through etching of the silicon dioxide layer 204 and the single crystal silicon epitaxial layer 203 so as to reveal the buried porous silicon layer 202.

Figure 9:
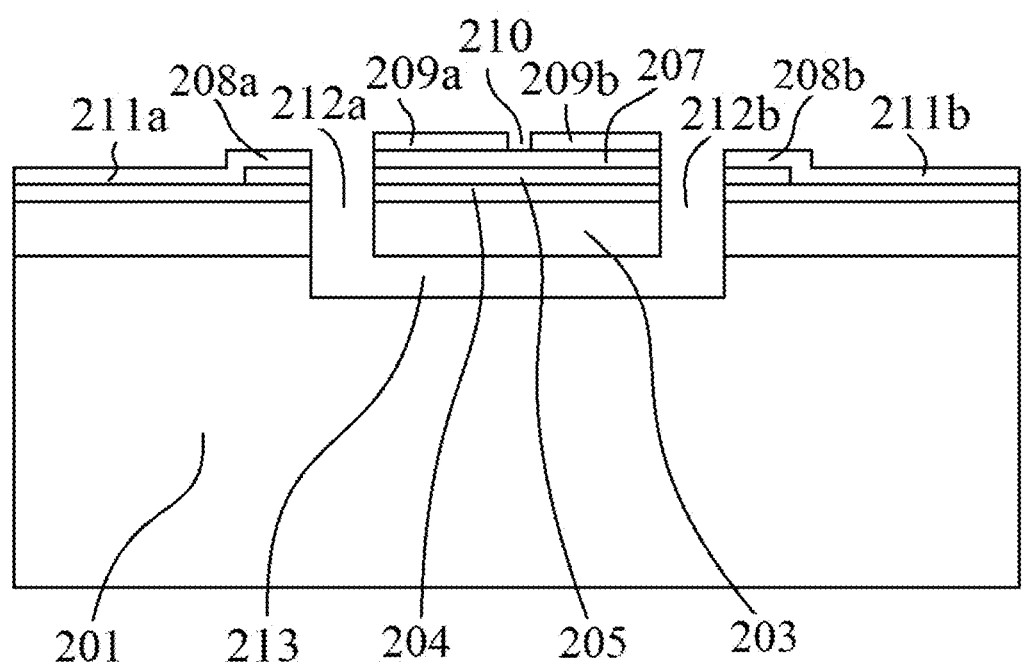

Reference to FIG. 9, a buried cavity 213 is created by selective etching of the porous silicon layer 202 through the trench part 212a and trench part 212b and then a suspended resonance structure is resulted which includes the bottom electrode 205, the piezoelectric resonance layer 207, the top drive electrode 209a, the top sense electrode 209b and the two supporting beams 110 as shown in FIG. 1.

To avoid any damage of the Al interconnection during a CMOS compatible process, a tetramethylammonium hydroxide (TMAH) solution with silicon powder and $(NH_4)_2S_2O_8$ solution is used to remove the porous silicon layer 202.

If the piezoelectric MEMS resonator is not integrated with a CMOS IC, it is preferred to conduct a post MEMS process for releasing the suspended structure. In this process the porous silicon layer is removed by a diluted KOH solution so as to finish the fabrication flow for the piezoelectric MEMS resonator.

Thus, a piezoelectric MEMS resonator based on porous silicon related technologies has been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A method for fabricating a piezoelectric MEMS resonator based on porous silicon related technologies which comprises fabrication steps:

Forming a porous silicon layer in a silicon substrate by anodic etching of crystalline silicon in hydrofluoric acid;

Growing a single crystal silicon layer on the entire surface of the silicon substrate including the surface of the porous silicon layer by chemical vapor deposition (CVD);

Depositing a silicon dioxide layer on the entire surface of a silicon epitaxial layer by plasma enhanced chemical vapor deposition (PECVD);

Creating a bottom electrode and two bonding pads on the surface of the silicon dioxide layer by metal sputtering and lift-off process;

Creating a piezoelectric resonance element on the surface of the bottom electrode by piezoelectric material sputtering and lift-off process;

Creating a top drive electrode, a top sense electrode, a top electrode isolation gap and two bonding pads wherein the top drive electrode, the top sense electrode, and the top electrode isolation gap are deposited on the surface of the piezoelectric resonance element and wherein the two bonding pads are deposited on the surface of the silicon dioxide layer by metal sputtering and lift-off process;

Creating a trench by plasma etching so as to divide the surface of the silicon substrate into two regions: a central region including the top electrode, the top sense electrode and the top electrode isolation gap and a surrounding region including the two bonding pads connected to the bottom electrode and the two bonding pads connecting the top drive electrode and the top sense electrode, wherein the trench is separated by two symmetrical supporting beams which connect the two separated regions and lower of the trench is created by plasma etching of the silicon dioxide layer and the single crystal silicon epitaxial layer so as to reveal the buried porous silicon layer; and Removing the porous silicon layer by selective etching of the porous silicon layer so as to result in a buried cavity and suspend the central region and two flexible single crystal silicon beams over the buried cavity.

2. The method of claim 1, wherein the porous silicon layer is a double layer structure with a top layer of ~20% porosity and a bottom layer of ~50% porosity.

3. The method of claim 1, wherein the silicon epitaxial layer has a specification allowed to be optimized for CMOS integrated circuit design and fabrication.

4. The method of claim 1, wherein the silicon epitaxial layer has a thickness with a common range of 1 to 30 µm and allowed it to be optimized for the piezoelectric MEMS resonator design and fabrication.

5. The method of claim 1, wherein the bottom electrode device elements are made of Cr/Au.

6. The method of claim 1, wherein the piezoelectric device elements are made of $Pb(Zr,Ti)O_3$ (PZT)), ZnO or AlN.

7. The method of claim 1, wherein the bottom electrode device elements are made of Pt/Au.

8. The method of claim 1, wherein the porous silicon layer is etched using a tetramethylammonium hydroxide (TMAH) solution with silicon powder and $(NH_4)_2S_2O_8$.

9. The method of claim 1, wherein the porous silicon layer is etched using a diluted KOH solution.

10. The method of claim 1, wherein the buried cavity with a vertical gap with a common range of 1 to 5 µm and able to prevent the suspending central region and the two flexible single crystal silicon beams from damage due to a vertical external force such as a mechanical shock to occur.

11. The method of claim 1, wherein the buried cavity is made rough enough by etching the porous silicon layer so as to prevent the microstructure from sticking to the bottom when the microstructure occasionally touches the bottom.

* * * * *